United States Patent
Ho

(10) Patent No.: US 10,707,849 B2
(45) Date of Patent: Jul. 7, 2020

(54) SYNCHRONOUS MIRROR DELAY CIRCUIT AND SYNCHRONOUS MIRROR DELAY OPERATION METHOD

(71) Applicant: Winbond Electronics Corp., Taichung (TW)

(72) Inventor: Wen-Chiao Ho, Taichung (TW)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 16/537,011

(22) Filed: Aug. 9, 2019

(65) Prior Publication Data
US 2020/0052680 A1 Feb. 13, 2020

(30) Foreign Application Priority Data

Aug. 10, 2018 (TW) ................................ 107127947 A

(51) Int. Cl.
*G11C 7/10* (2006.01)
*H03K 5/135* (2006.01)
*G11C 7/22* (2006.01)

(52) U.S. Cl.
CPC ............. *H03K 5/135* (2013.01); *G11C 7/222* (2013.01)

(58) Field of Classification Search
CPC .. G11C 7/10; G11C 7/22; G11C 7/222; G11C 7/1072; G11C 7/1066
See application file for complete search history.

(56) References Cited

U.S. PATENT DOCUMENTS

| | | | |
|---|---|---|---|
| 6,060,928 A | 5/2000 | Jun et al. | |
| 6,310,822 B1 | 10/2001 | Shen | |
| 6,373,913 B1* | 4/2002 | Lee | H03K 5/135 375/376 |
| 6,570,813 B2 | 5/2003 | Van De Graaff | |
| 6,621,316 B1 | 9/2003 | Kirsch | |
| 6,801,472 B2 | 10/2004 | Lee | |
| 6,812,799 B2 | 11/2004 | Kirsch | |
| 6,822,922 B2 | 11/2004 | Kato | |
| 7,111,185 B2 | 9/2006 | Gomm et al. | |
| 2002/0015338 A1 | 2/2002 | Lee | |
| 2002/0176315 A1 | 11/2002 | Graaff | |
| 2003/0122598 A1 | 7/2003 | Kim et al. | |

(Continued)

FOREIGN PATENT DOCUMENTS

| | | |
|---|---|---|
| TW | 200418268 A | 9/2004 |
| TW | 201737625 A | 10/2017 |

*Primary Examiner* — Sibin Chen
(74) *Attorney, Agent, or Firm* — Muncy, Geissler, Olds & Lowe, P.C.

(57) ABSTRACT

A synchronous mirror delay (SMD) circuit is provided in the invention. The SMD circuit includes a delay monitor circuit (DMC), a forward delay circuit, a first shift circuit, a backward delay circuit, a second shift circuit and a clock-frequency-checker (CSC) circuit. The CSC circuit is coupled to the first shift circuit and the second shift circuit. The CSC circuit determines whether the frequency of the external input clock signal is slower than the frequency of the reference clock signal to generate a judgment result, and the CSC circuit transmits the judgment result to the first shift circuit and the second shift circuit. The first shift circuit and the second shift circuit determine whether to delay the external input clock signal according to the judgment result.

14 Claims, 12 Drawing Sheets

(56) References Cited

U.S. PATENT DOCUMENTS

| | | |
|---|---|---|
| 2004/0178836 A1 | 9/2004 | Kim et al. |
| 2005/0138457 A1 | 6/2005 | Gomm et al. |
| 2007/0046347 A1 | 3/2007 | Lee |
| 2015/0029800 A1 | 1/2015 | Iijima et al. |
| 2017/0207777 A1 | 7/2017 | Lo et al. |

* cited by examiner

SYNCHRONOUS MIRROR DELAY CIRCUIT AND SYNCHRONOUS MIRROR DELAY OPERATION METHOD

CROSS REFERENCE TO RELATED APPLICATIONS

This application claims priority of TW Patent Application No. 107127947 filed on Aug. 10, 2018, the entirety of which is incorporated by reference herein.

BACKGROUND OF THE INVENTION

Field of the Invention

The invention generally relates to synchronous mirror delay (SMD) circuit technology, and more particularly, to SMD technology applied to the large frequency bandwidth.

Description of the Related Art

Synchronous mirror delay (SMD) circuits are widely applied in the designs of the integrated circuits. For different external input clock signals of an integrated circuit, the SMD circuit may be configured to synchronize the external input clock signal and the internal operation clock signal of the integrated circuit.

As shown in FIG. 1, the integrated circuit 100 may comprise an input buffer 110, an SMD circuit 120 and a clock driver 130. In addition, the SMD circuit 120 may comprise a delay monitor circuit (DMC) 121, a forward delay circuit 123, a phase detector circuit 124, and a backward delay circuit 125, wherein the forward delay circuit 123, the phase detector circuit 124 and the backward delay circuit 125 may comprise a plurality of stages of delay units. FIG. 2 shows the original external-input clock signal $CLK_{EXT}$, internal operation clock signal $CLK_{INT}$, and the signals of the external-input clock signal $CLK_{EXT}$ at points B, D and E.

Referring to FIG. 2, in the operation of the traditional SMD circuit, in order to synchronize the external input clock signal $CLK_{EXT}$ with the internal operation clock signal $CLK_{INT}$ of the integrated circuit, the delay tV from point B to point D in the SMD circuit 120 needs to meet the condition tV=tCL−(d1+d2), wherein tV means the delay between the forward delay circuit 123 and the backward delay circuit 125, and the tCL means the period of the external input clock signal $CLK_{EXT}$. Therefore, according to the above condition, after derivation (i.e. 2*d1+d2+2*tV+d2=2*d1+d2+2*[tCK−(d1+d2)]+d2=2*tCK), we can know that after 2*tCK, the external input clock signal $CLK_{EXT}$ can synchronize with the internal operation clock signal $CLK_{INT}$.

However, in the operation of a traditional SMD circuit, the period of the external input clock signal $CLK_{EXT}$ cannot be known, therefore, many stages of delay units need to be configured in advance to make sure that the external input clock signal $CLK_{EXT}$ can still synchronize with the internal operation clock signal $CLK_{INT}$, when the period of the external input clock signal $CLK_{EXT}$ is too slow.

However, for these multiple stages of delay units, the SMD circuit may require a larger current, and a larger physical size will be required for the manufacturing process of the SMD circuit.

BRIEF SUMMARY OF THE INVENTION

The invention provides a synchronous mirror delay (SMD) circuit to overcome the problems described above.

The SMD circuit of the invention can be applied to a large frequency bandwidth. In addition, compared with traditional SMD, the SMD circuit of the invention has lower current consumption and smaller size.

An embodiment of the invention provides a synchronous mirror delay (SMD) circuit. The SMD circuit comprises a delay monitor circuit (DMC), a forward delay circuit, a first shift circuit, a backward delay circuit, a second shift circuit and a clock-frequency-checker (CSC) circuit. The DMC is coupled to an input buffer. The first shift circuit is coupled to the DMC and the forward delay circuit. The second shift circuit is coupled to the backward delay circuit and a clock driver. The CSC circuit is coupled to the first shift circuit and the second shift circuit. The CSC circuit determines whether the frequency of the external input clock signal is slower than the frequency of the reference clock signal to generate a judgment result, and the CSC circuit transmits the judgment result to the first shift circuit and the second shift circuit. The first shift circuit and the second shift circuit determine whether to delay the external input clock signal according to the judgment result.

An embodiment of the invention provides a synchronous mirror delay (SMD) operation method. The SMD method is applied to an SMD circuit. The SMD method comprises the following steps: the clock-frequency-checker (CSC) circuit of the SMD circuit determines whether the frequency of the external input clock signal is slower than the frequency of the reference clock signal and generates a judgment result; the judgment result is transmitted to a first shift circuit and a second shift circuit of the SMD circuit; and the first shift circuit and the second shift circuit determine whether to delay the external input clock signal according to the judgment result.

Other aspects and features of the invention will become apparent to those with ordinary skill in the art upon review of the following descriptions of specific embodiments of the SMD circuit and method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
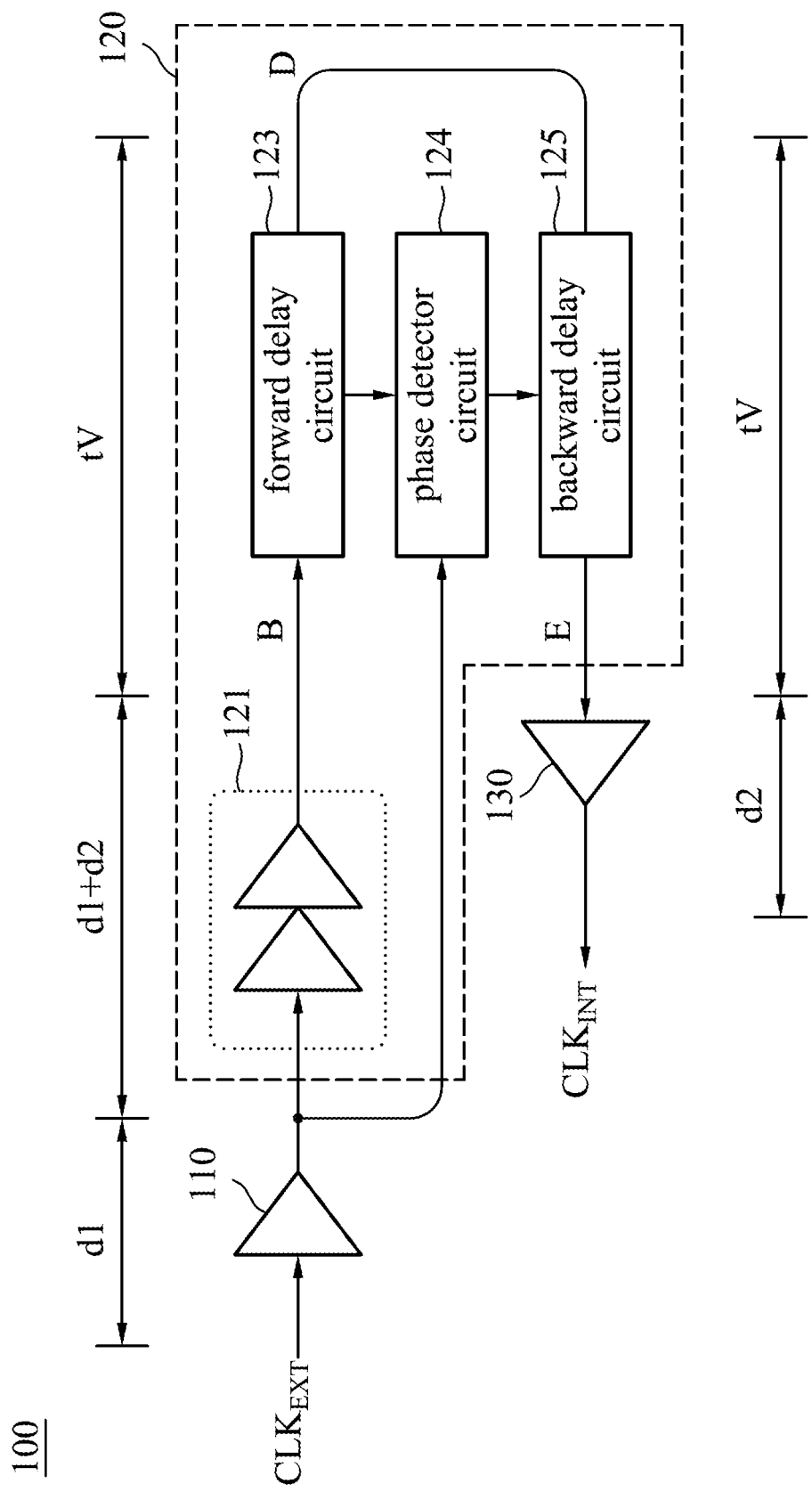
FIG. 1 is a block diagramn of the a memory circuit according to a prior art.
Figure 2:
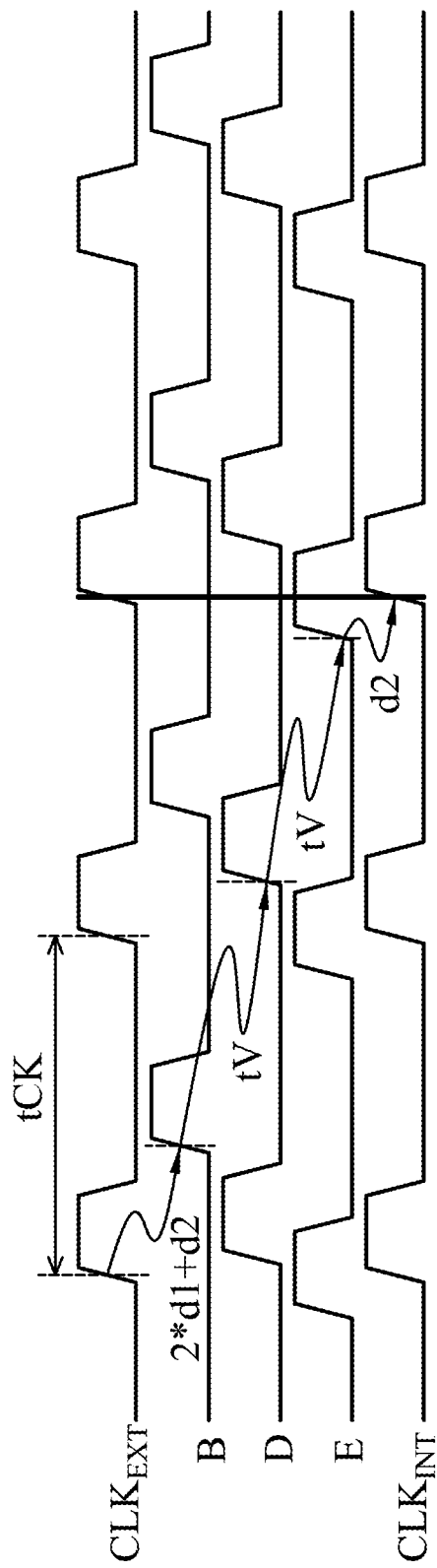
FIG. 2 is a timing diagram of a memory circuit.
Figure 3:
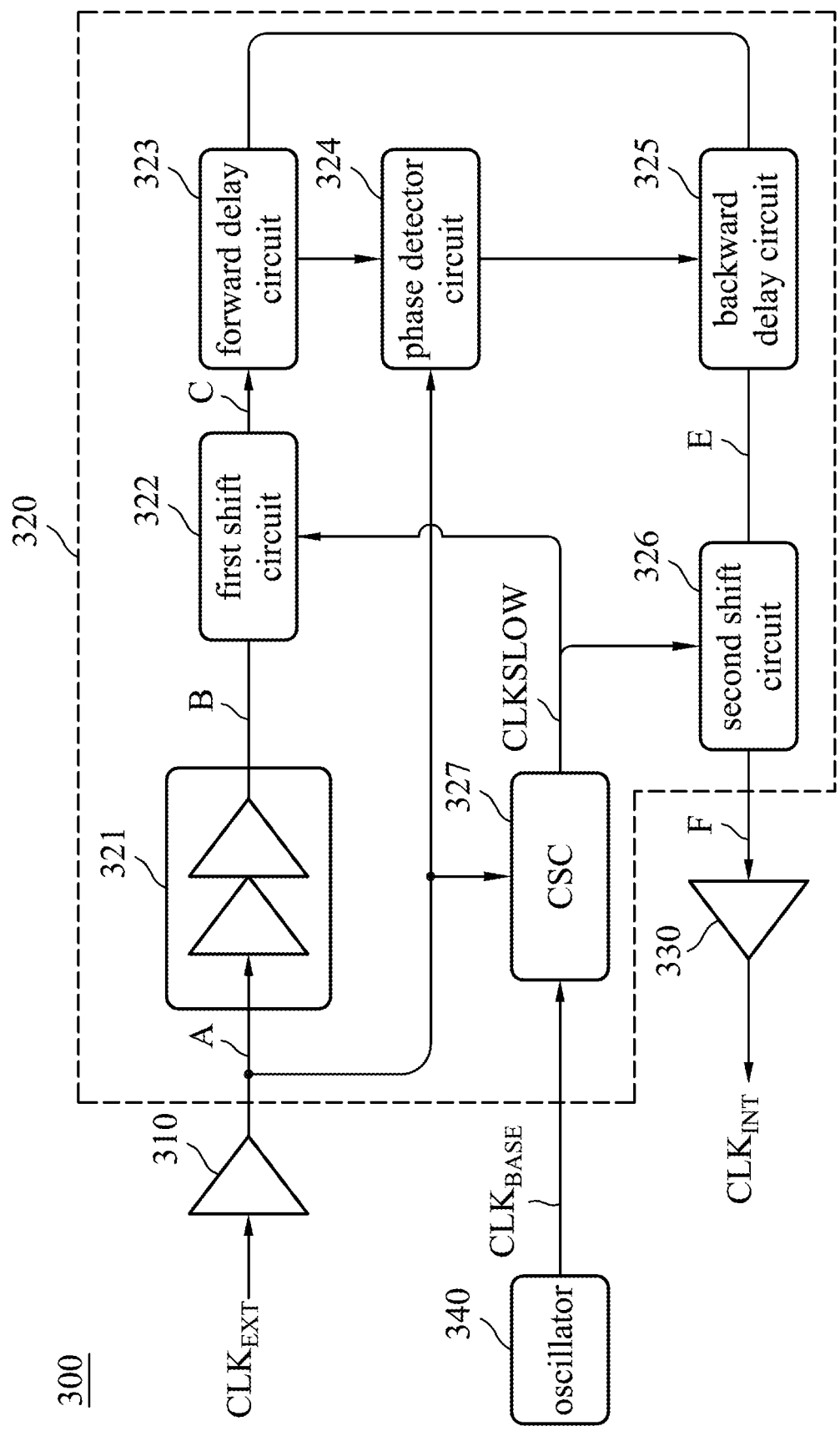
FIG. 3 is a circuit diagram of a memory circuit according to an embodiment of the invention.

FIG. 3 is a circuit diagram of a memory circuit 300 according to an embodiment of the invention. As shown in FIG. 3, the memory circuit 300 may comprise an input buffer 310, a synchronous mirror delay (SMD) circuit 320, a clock driver 330 and an oscillator 340.

As shown in FIG. 3, the SMD circuit 320 may comprise a delay monitor circuit (DMC) 321, a first shift circuit 322, a forward delay circuit 323, a phase detector circuit 324, and a backward delay circuit 325, a second shift circuit 326 and a clock-frequency-checker (CSC) circuit 327. The DMC may comprise a dummy input buffer and a dummy clock driver. The forward delay circuit 323, the phase detector circuit 324, and the backward delay circuit 325 may comprise a plurality of stages of delay units.

After the external input clock signal $CLK_{EXT}$ is inputted to the SMD circuit 320 through the input buffer 310, the external input clock signal $CLK_{EXT}$ will be transmitted to the DMC 321 and the CSC circuit 327. The CSC circuit 327 may generate a judgment result CLKSLOW according to the external input clock signal $CLK_{EXT}$ and the reference clock signal $CLK_{BASE}$ generated by the oscillator 340, and the CSC circuit 327 may transmit the judgment result CLKSLOW to the first shift circuit 322 and the second shift circuit 326. Then, the first shift circuit 322 may determine whether the external input clock signal $CLK_{EXT}$ outputted by the DMC 321 needs to be delayed before the external input clock signal $CLK_{EXT}$ is processed by the forward delay circuit 323, the phase detector circuit 324, and the backward delay circuit 325. Finally, the second shift circuit 326 may do the same operation as the first shift circuit 322 for the external input clock signal $CLK_{EXT}$ outputted by the backward delay circuit 325 and then the second shift circuit 326 may transmit the processed external input clock signal $CLK_{EXT}$ to the clock driver 330 to generate the internal operation clock signal $CLK_{INT}$ of the control circuit of the clock driver 330. Details will be discussed in the embodiments below.

Figure 4:
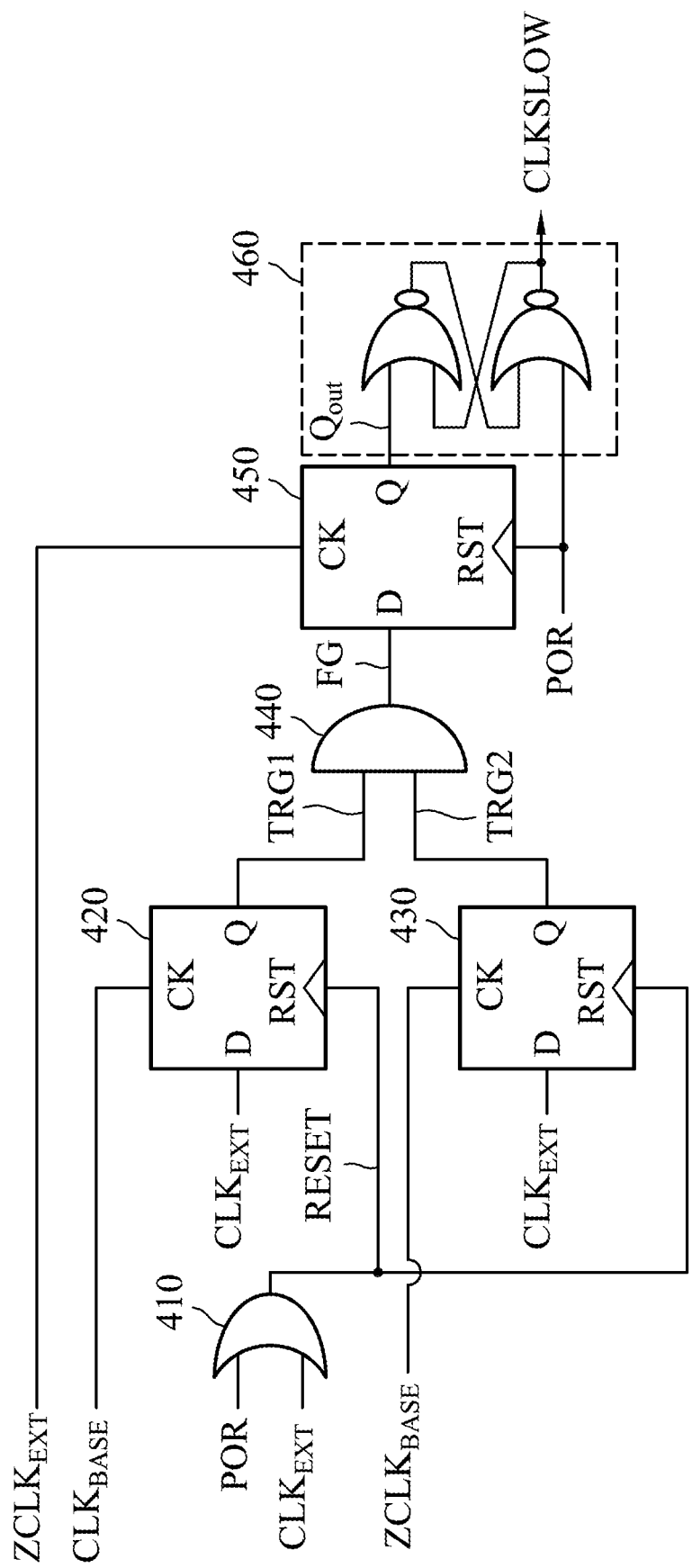
FIG. 4 is a circuit diagram of a clock-frequency-checker (CSC) circuit according to an embodiment of the invention.

As shown in FIG. 4, the CSC circuit 327 may comprise an OR gate 410, a first register 420, a second register 430, an OR gate 440, a third register 450 and SR latch 460. It should be noted that the CSC circuit may be other circuit structures to achieve equivalent function.

As shown in FIG. 4, the OR gate 410 may receive an enable reset signal POR or receive the external input clock signal $CLK_{EXT}$. When the OR gate 410 receives the reset signal POR or receive the external input clock signal $CLK_{EXT}$, the OR gate 410 may transmit a reset signal RESET to the pin RST of the first register 420 and the pin RST of the second register 430 to reset the value of the pin Q of the first register 420 and reset the value of the pin Q of the second register 430 (e.g. reset the value of the pin Q to 0). That is to say, when the rising edge of the reset signal POR or the external input clock signal $CLK_{EXT}$ is enabled, the value of the pin Q of the first register 420 and the value of the pin Q of the second register 430 will be reset (e.g. reset the value of the pin Q to 0).

Figure 5A:
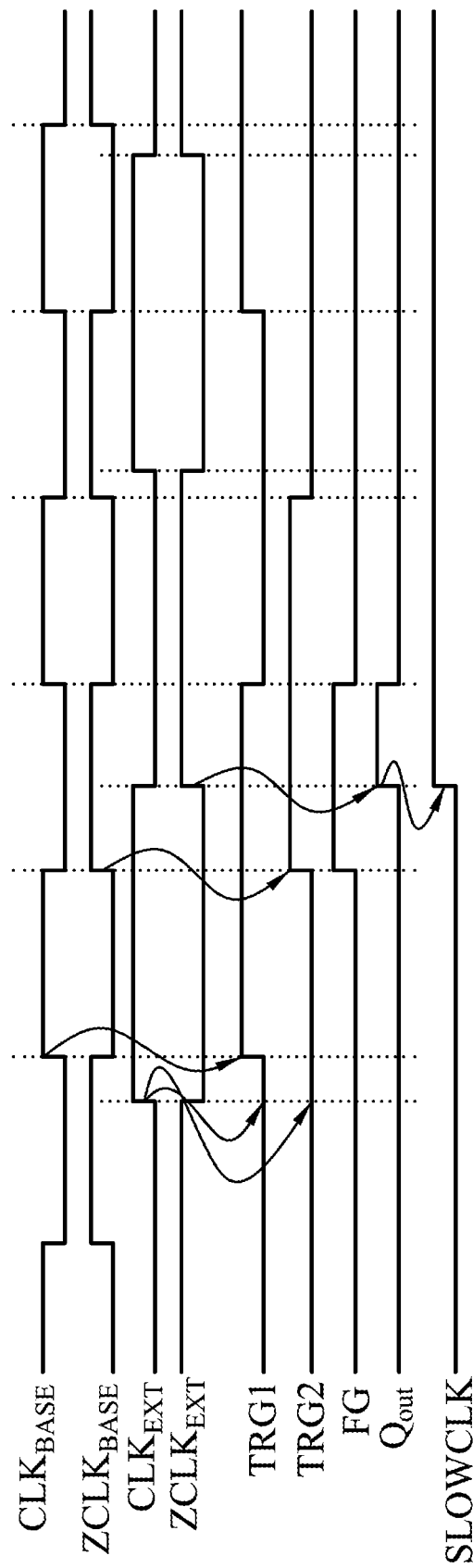
FIG. 5A is a timing diagram when the frequency of the external input clock signal is slower than the frequency of the reference clock signal according to an embodiment of the invention.
Figure 5B:
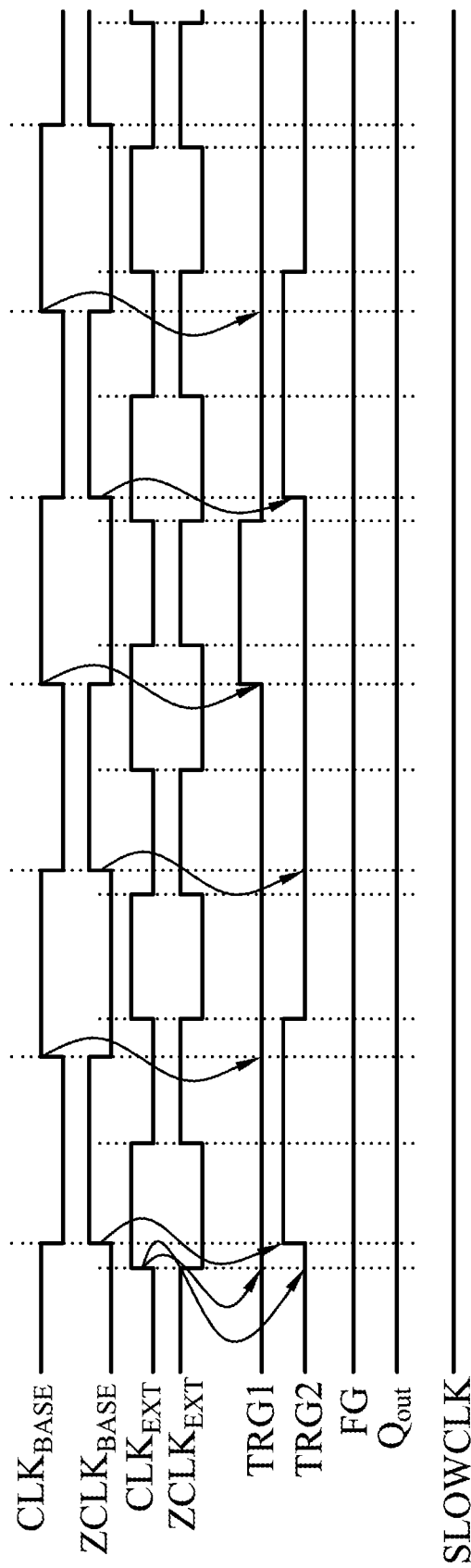
FIG. 5B is a timing diagram when the frequency of the external input clock signal is faster than the frequency of the reference clock signal according to an embodiment of the invention.

In the embodiment, the pin CK of the first register 420 may receive the reference clock signal $CLK_{BASE}$ and the pin D of the first register 420 may receive the clock signal $CLK_{EXT}$. The value of the clock signal $CLK_{EXT}$ may be transmitted to the pin Q of the first register 420 at each rising-edge of the reference clock signal $CLK_{BASE}$ to output the first trigger signal TRG1 to the AND gate 440 (as shown in FIGS. 5A-5B). In addition, the pin CK of the second register 430 may receive the reverse reference clock signal $ZCLK_{BASE}$ and the pin D of the second register 430 may receive the clock signal $CLK_{EXT}$. The value of the clock signal $CLK_{EXT}$ may be transmitted to the pin Q of the second register 430 at each rising-edge of the reverse reference clock signal $ZCLK_{BASE}$ to output the second trigger signal TRG2 to the AND gate 440 (as shown in FIGS. 5A-5B). When the AND gate 440 receives the first trigger signal TRG1 and the second trigger signal TRG2, the AND gate 440 may perform AND operation for the first trigger signal TRG1 and the second trigger signal TRG2 to generate the flag signal FG. Then, the AND gate 440 may transmit the flag signal FG to the pin D of the third register.

In addition, in the embodiment, the pin CK of the third register 450 may receive the reverse external input clock signal $ZCLK_{EXT}$. The value of the flag signal FG may be transmitted to the pin Q of the third register 450 at each rising-edge of the reverse external input clock signal $ZCLK_{EXT}$ to output the output signal $Q_{out}$ to the SR latch 460. After the SR latch 460 receives the output signal $Q_{out}$, the SR latch 460 may generate the judgment result CLKSLOW according to the output signal $Q_{out}$. According to an embodiment of the invention, when the judgment result CLKSLOW is at a first level (e.g. 1), it means that the frequency of the external input clock signal $CLK_{EXT}$ is slower than the frequency of the reference clock signal $CLK_{BASE}$, and when the judgement result CLKSLOW is at a second level (e.g. 0), it means that the frequency of the external input clock signal $CLK_{EXT}$ is not slower than the frequency of the reference clock signal $CLK_{BASE}$.

Referring to FIG. 5A, the AND gate 440 may perform AND operation for the first trigger signal TRG1 and the second trigger signal TRG2. Therefore, when the value of the first trigger signal TRG1 and the value of the second trigger signal TRG2 are high level (e.g. 1), the value of the flag signal FG is high level (e.g. 1). In addition, the flag signal FG is transmitted to the pin Q of the third register 450 at each rising-edge of the reverse external input clock signal $ZCLK_{EXT}$ output the output signal $Q_{out}$ to the SR latch 460. Therefore, when the output signal $Q_{out}$ is high level (e.g. 1), the judgment result CLKSLOW outputted by the SR latch 460 will be high level (e.g. 1). When the judgment result CLKSLOW is high level, it means that the frequency of the external input clock signal $CLK_{EXT}$ is slower than the frequency of the reference clock signal $CLK_{BASE}$. Therefore, the external input clock signal $CLK_{EXT}$ needs to be shifted a period of time by the first shift circuit 322 and the second shift circuit 326. Accordingly, the internal operation clock signal $CLK_{INT}$ can synchronize with the original external input clock signal $CLK_{EXT}$ without configuring too many stages of delay units in the forward delay circuit 323, the phase detector circuit 324, and the backward delay circuit 325.

It should be noted that in the embodiments of the invention, the forward delay circuit 323 and the backward delay circuit 325 may generate the delay tV respectively. In addition, in the embodiments of the invention, the delay generated by the first shift circuit 322 and the second shift circuit 326 may be greater than the delay tV.

On the other hand, as shown in FIG. 5B, because the value of the first trigger signal TRG1 and the value of the second trigger signal TRG2 are not high level (e.g. 1) at the same time, the value of the flag signal FG will be low level (e.g. 0). Because the value of the flag signal FG is low level (e.g. 0), the judgment result CLKSLOW outputted by the SR latch 460 will be low level (e.g. 0). When the judgment result CLKSLOW is not high level, it means that the frequency of the external input clock signal $CLK_{EXT}$ is not slower than the frequency of the reference clock signal $CLK_{BASE}$. Therefore, the external input clock signal $CLK_{EXT}$ does not need to be shifted a period of time by the first shift circuit 322 and the second shift circuit 326.

Figure 5C:
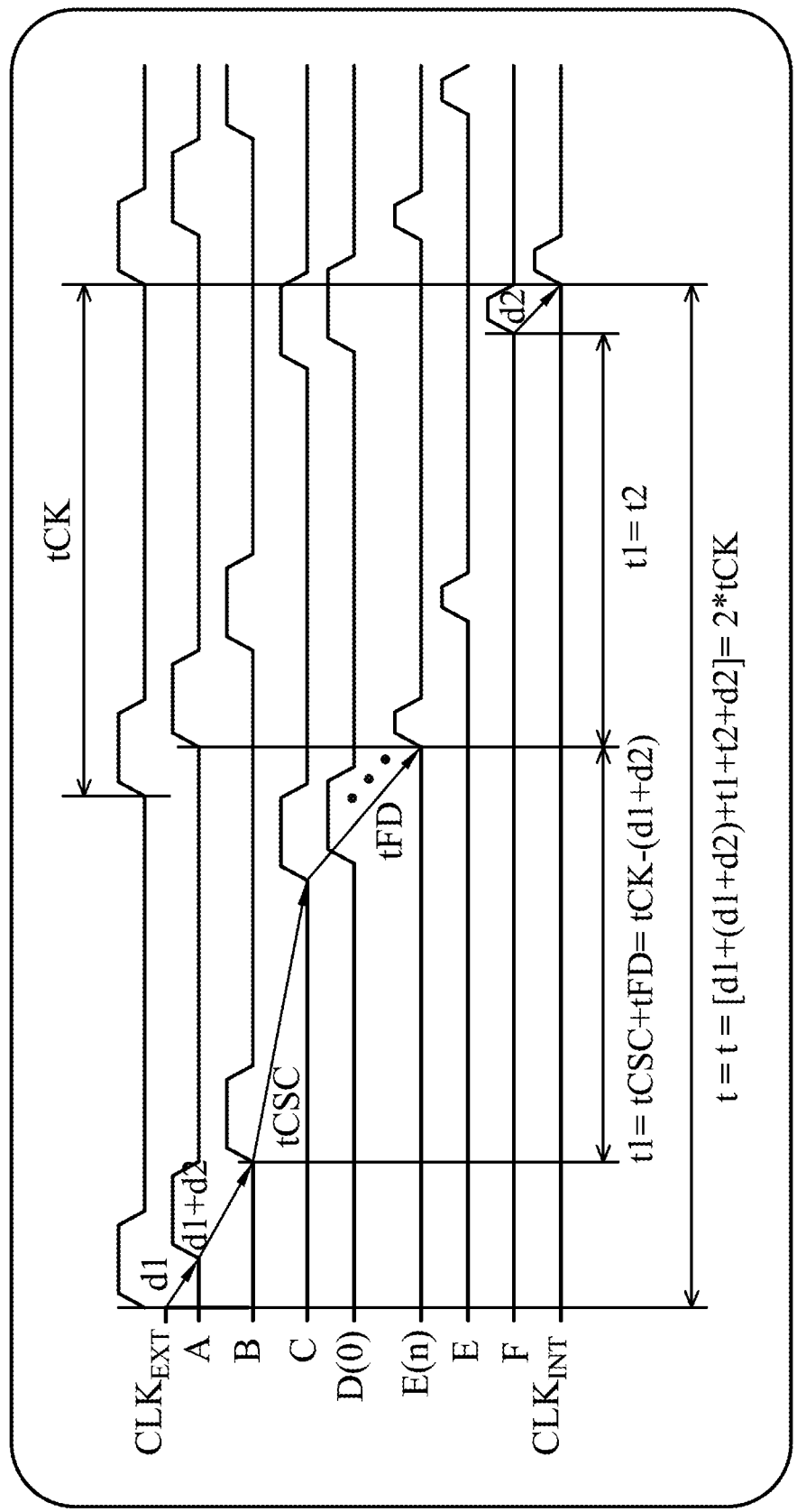
FIG. 5C is a timing diagram of the memory circuit according to an embodiment of the invention.

Referring to FIG. 3 and FIG. 5C, according to the embodiment of the invention, the forward delay circuit 323 may comprise delay units D(0)~D(n), and the backward delay circuit 325 may comprise delay units E(0)~E(n). The delay from point B of the SMD circuit 320 to the delay unit E(n) of the backward delay circuit 325 is t1, and the delay from the delay unit E(n) of the backward delay circuit 325 to the clock driver 330 is t2, wherein t1=tCSC+tFD, and t1=t2, and wherein tCSC means the delay time of the first shift circuit 322 and the second shift circuit 326 and the tFD means the delay time of the forward delay circuit 323 and the backward delay circuit 325. Therefore, in order to synchronize the external input clock signal $CLK_{EXT}$ with the internal operation clock signal circuit $CLK_{INT}$, the delay t1 from point B of the SMD circuit 320 to the delay unit E(n) of the backward delay circuit 325 needs to meet a condition, t1=tCK−(d1+d2), to make the total delay time equal to the double time tCK (i.e. t=[d1+(d1+d2)+t1+t2+d2])=2*tCK). Therefore, in the embodiment of the invention, the judgment result CLKSLOW is used to determine the delay time of the first shift circuit 322 and the second shift circuit 326 to meet the above condition. Therefore, in the invention, the internal operation clock signal $CLK_{INT}$ can synchronize with the original external input clock signal $CLK_{EXT}$ without configuring too many stages of delay units in the forward delay circuit 323, the phase detector circuit 324, and the backward delay circuit 325.

Figure 6:
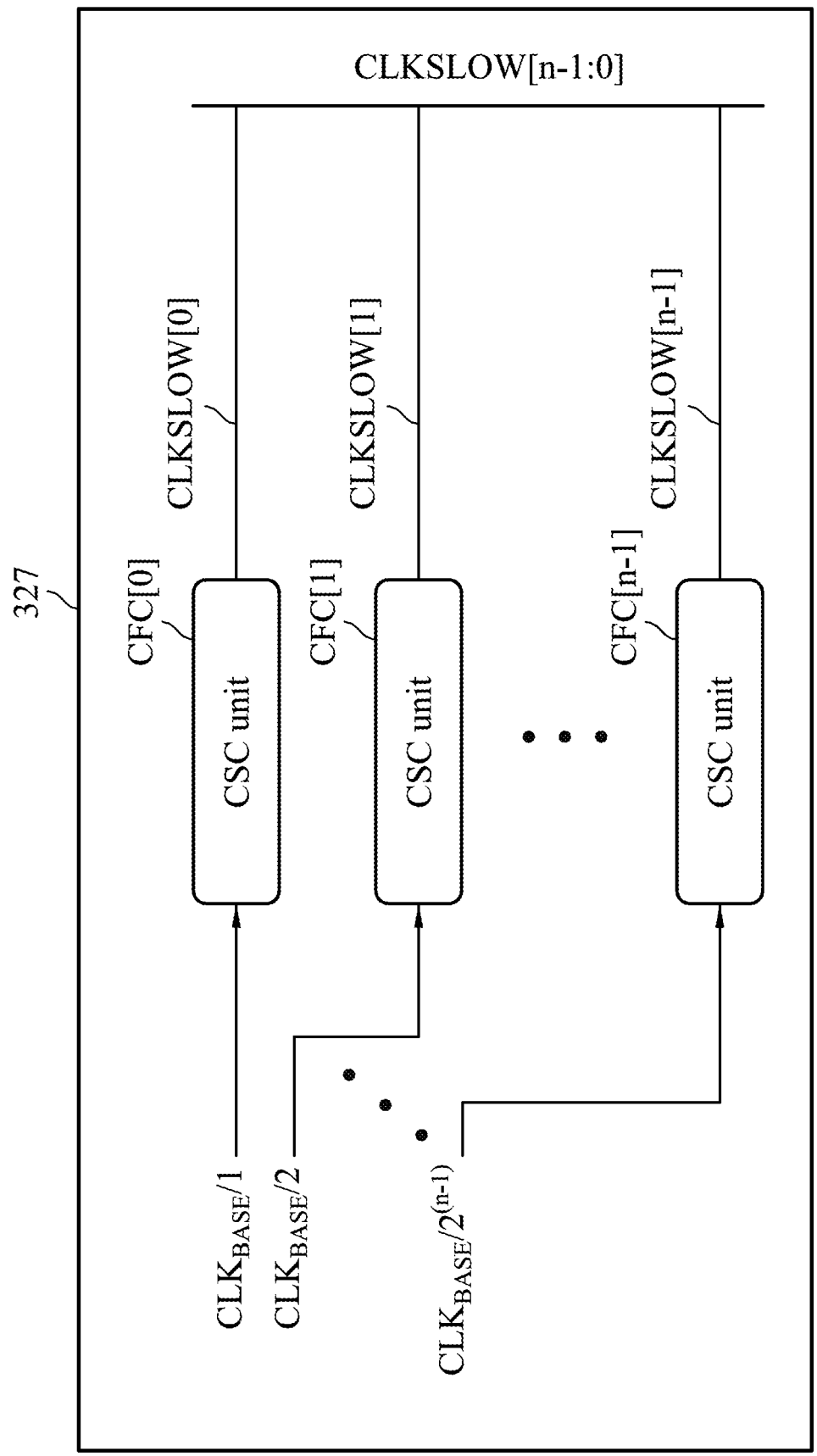
FIG. 6 is a schematic diagram of a CSC circuit according to an embodiment of the invention.

As shown in FIG. 6, the CSC circuit 327 may comprise a plurality of CSC units CFC[0]~CFC[n−1], wherein n is positive integer. Each CSC unit CFC[0]~CFC[n−1] may be applied to the structure of FIG. 4. According to an embodiment of the invention, the SMD circuit 320 further comprises a frequency divider (not shown in figures). The frequency divider may perform frequency division for the reference clock signal $CLK_{BASE}$ to generate the reference clock signals $CLK_{BASE}$ with different frequencies, e.g. the reference clock signals $CLK_{BASE}/1$, $CLK_{BASE}/2$ ..., $CLK_{BASE}/2^{(n-1)}$ as shown in FIG. 6.

As shown in FIG. 6, the CSC units CFC[0]~CFC[n−1] of the CSC circuit 327 may respectively receive the reference clock signals $CLK_{BASE}/1$, $CLK_{BASE}/2$ ..., $CLK_{BASE}/2^{(n-1)}$ which have different frequencies respectively (e.g. the CSC unit CFC[0] may receive reference clock signal $CLK_{BASE}/1$, the CSC unit CFC[1] may receive reference clock signal $CLK_{BASE}/2$, and CSC unit CFC[n−1] may receive reference clock signal $CLK_{BASE}/2^{(n-1)}$). Each CSC unit CFC[0]~CFC[n−1] may respectively generate the judgment results CLKSLOW [0], CLKSLOW [1] ... CLKSLOW [n−1] according to the reference clock signals $CLK_{BASE}/1$, $CLK_{BASE}/2$ ..., $CLK_{BASE}/2^{(n-1)}$. Each CSC unit CFC[0]~CFC[n−1] may respectively transmit its judgment result CLKSLOW [0], CLKSLOW [1] ... CLKSLOW [n−1] to the first shift circuit 322 and the second shift circuit 326. The first shift circuit 322 and the second shift circuit 326 may determine how long the external input clock signal $CLK_{EXT}$ needs to be delayed (or shifted) according to all judgment results CLKSLOW [0], CLKSLOW [1] ... CLKSLOW [n−1]. For example, when there is only the value of the judgment result CLKSLOW [0] is 1 (i.e. only when the reference clock signal is $CLK_{BASE}/1$, is the frequency of the external input clock signal $CLK_{EXT}$ slower than the frequency of the reference clock signal $CLK_{BASE}$), it means that the frequency of the external input clock signal $CLK_{EXT}$ is a little slower than the frequency of the reference clock signal $CLK_{BASE}$. Therefore, the delay time of the external input clock signal $CLK_{EXT}$ will be shorter. When the value of the judgment result CLKSLOW [n−1] is 1 (i.e. for all of the reference clock signals $CLK_{BASE}/1$, $CLK_{BASE}/2$ ..., $CLK_{BASE}/2^{(n-1)}$, the frequency of the external input clock signal $CLK_{EXT}$ is slower than the frequency of the reference clock signal $CLK_{BASE}$), it means that the frequency of the external input clock signal $CLK_{EXT}$ is very slow. Therefore, the delay time of the external input clock signal $CLK_{EXT}$ will be longer.

Figure 7:
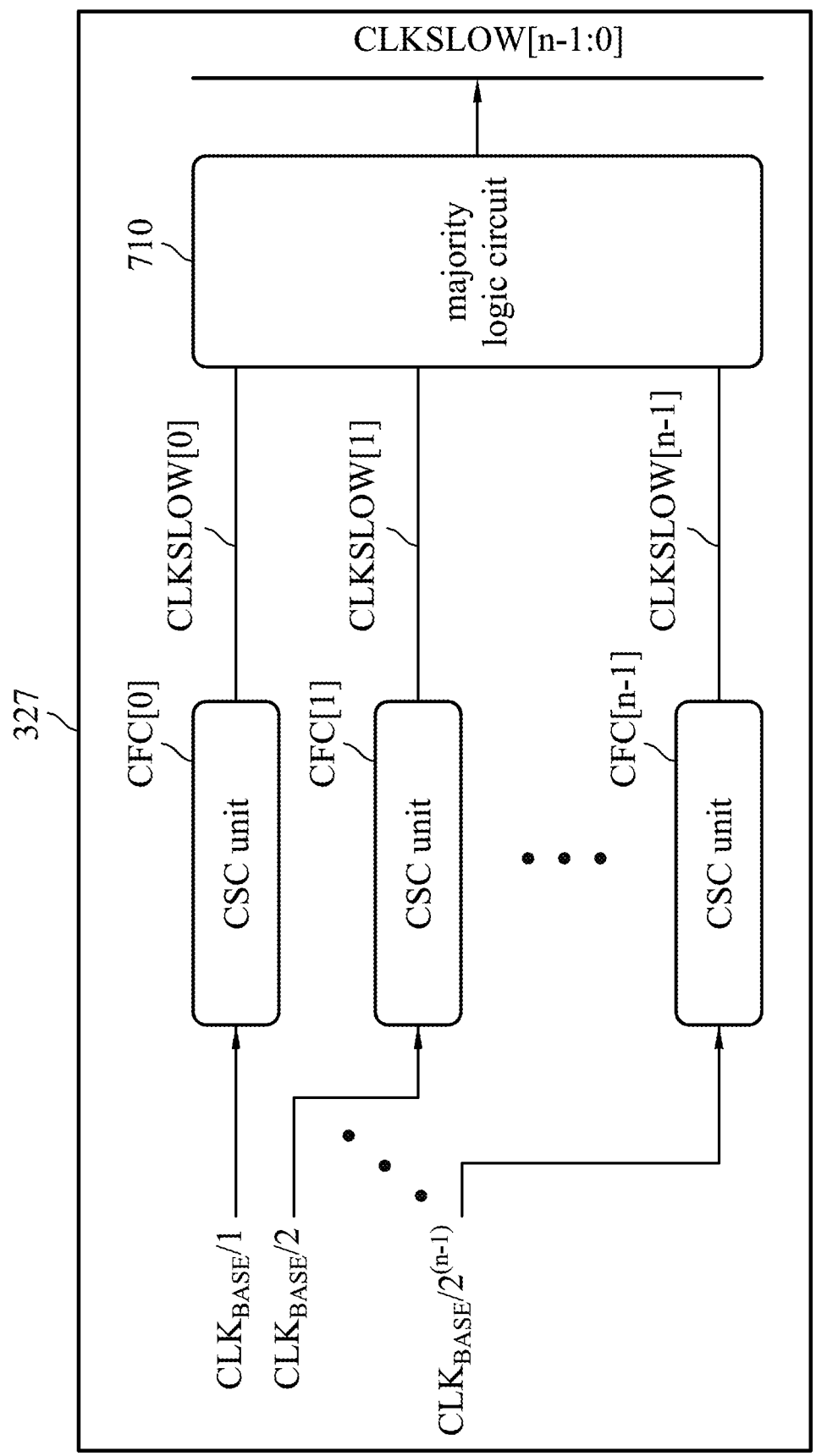
FIG. 7 is a schematic diagram of a CSC circuit according to another embodiment of the invention.

As shown in FIG. 7, the CSC circuit 327 may further comprise a majority logic circuit 710. The majority logic circuit 710 may be coupled to each of the CSC units CFC[0]~CFC[n−1] of the CSC circuit 327 to receive the judgment results CLKSLOW [0], CLKSLOW [1] ... CLKSLOW [n−1]. After the majority logic circuit 710 receives the judgment results CLKSLOW [0], CLKSLOW [1] ... CLKSLOW [n−1], the majority logic circuit 710 may ignore the unreasonable judgment result according to the judgment results CLKSLOW [0], CLKSLOW [1] ... CLKSLOW [n−1]. For example, if the judgment result CLKSLOW [2] for the reference clock signal $CLK_{BASE}/4$ and judgment result CLKSLOW [4] for the reference clock signal $CLK_{BASE}/16$ are 0 and 1 respectively, it means that the frequency of the external input clock signal $CLK_{EXT}$ is slower than the frequency of the reference clock signal $CLK_{BASE}/16$, but the frequency of the external input clock signal $CLK_{EXT}$ is faster than the frequency of the reference clock signal $CLK_{BASE}/4$. The results are conflict because the frequency of the reference clock signal $CLK_{BASE}/16$ is slower than the frequency of the reference clock signal $CLK_{BASE}/4$. Therefore, majority logic circuit 710 may refer to the judgment results CLKSLOW [0], CLKSLOW [1] and CLKSLOW [3]. If all the judgment results CLKSLOW [0], CLKSLOW [1] and CLKSLOW [3] are 1, the majority logic circuit 710 may adopt the judgment result CLKSLOW [4] for the reference clock signal $CLK_{BASE}/16$. That is to say, the majority logic circuit 710 may determine that the judgment result CLKSLOW [2] is wrong and ignore the judgment result CLKSLOW [2].

Figure 8:
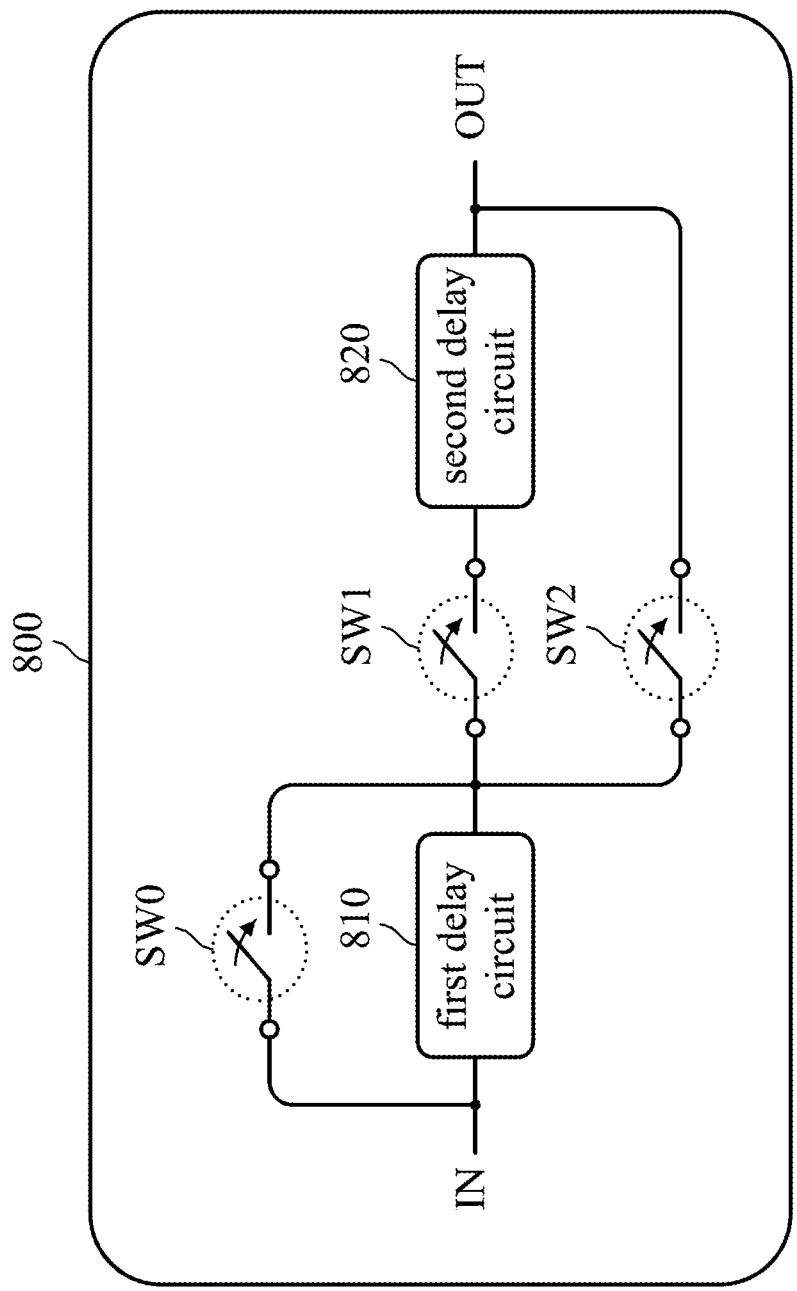
FIG. 8 is a schematic diagram of a shift circuit according to an embodiment of the invention.

According to an embodiment of the invention, the first shift circuit 322 and the second shift circuit 326 may comprise a plurality of switches and a plurality of delay circuits respectively for the requirements of the different judgment results. For example, when the judgment result CLKSLOW received by the first shift circuit 322 and the second shift circuit 326 are 3 bits (i.e. CLKSLOW [2:0]), two delay circuits will be configured in the first shift circuit 322 and the second shift circuit 326 for the requirements of the different judgment results CLKSLOW. When two delay circuits are configured in the first shift circuit 322 and the second shift circuit 326, the first shift circuit 322 and the second shift circuit 326 can generate 4 different delay times. In the embodiment, the two delay circuits may have different delay times. In addition, in the embodiment, the first shift circuit 322 and the second shift circuit 326 may determine to enable which switch according to the different judgment results CLKSLOW. That is to say, the first shift circuit 322 and the second shift circuit 326 may determine how long the external input clock signal $CLK_{EXT}$ received form the DMC 321 needs to be delayed (or shifted) according to the different judgment results CLKSLOW. FIG. 8 is taken for example below.

The shift circuit 800 as shown in FIG. 8 can be applied to the first shift circuit 322 and the second shift circuit 326. The shift circuit 800 may comprise an input end IN, an output end OUT, a first switch SW0, a second switch SW1, a third switch SW2, a first delay circuit 810 and a second circuit 820. The first delay circuit 810 and the second delay circuit 820 may correspond to the delay time delay 1 and the delay time delay 2 respectively. When the judgment result CLKSLOW is [000], the first switch SW0 and the third switch SW2 are opened and the second switch SW1 is closed. Therefore, no delay is generated by the shift circuit 800. When the judgment result CLKSLOW is [100], the third switch SW2 is opened and the first switch SW0 and the second switch SW1 are closed. Therefore, the shift circuit 800 may generate the delay time delay 1. When the judgment result CLKSLOW is [110], the first switch SW0 and the second switch SW1 are opened and the third switch SW2 is closed. Therefore, the shift circuit 800 may generate the delay time delay 2. When the judgment result CLKSLOW is [111], the second switch SW1 is opened and the first switch SW0 and the third switch SW2 are closed. Therefore, the shift circuit 800 may generate the delay time delay 1 plus delay 2.

Figure 9:
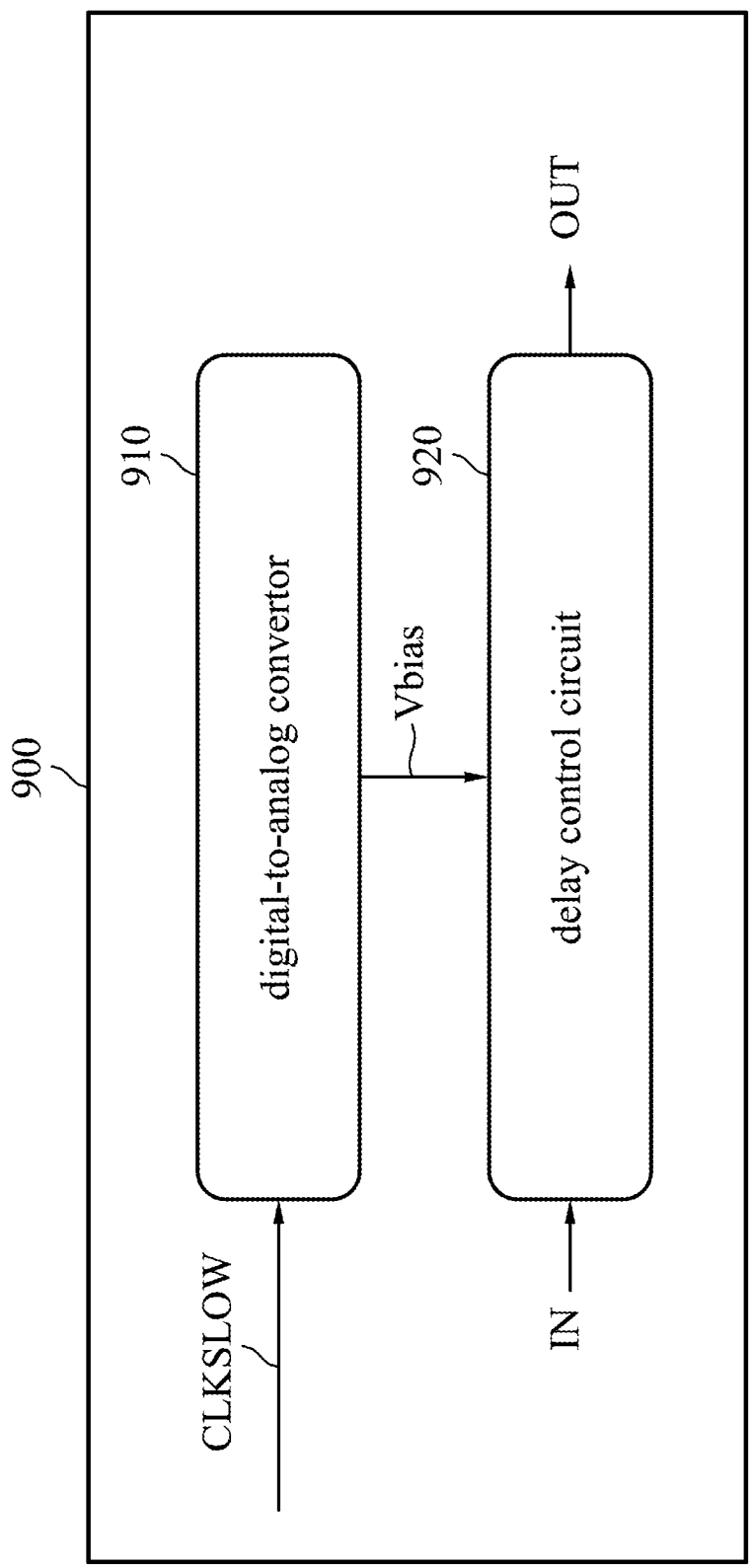
FIG. 9 is a schematic diagram of a shift circuit according to another embodiment of the invention.

The shift circuit 900 as shown in FIG. 9 can be applied to the first shift circuit 322 and the second shift circuit 326. The shift circuit 800 may comprise an input end IN, an output end OUT, a digital-to-analog convertor 910 and a delay control circuit 920. The digital-to-analog convertor 910 may receive the judgment result CLKSLOW from the CSC circuit 327, and according to the judgment result CLKSLOW, generates the voltage level signal Vbias corresponding to the judgment result CLKSLOW. Then, the digital-to-analog convertor 910 may transmit the voltage level signal Vbias to the delay control circuit 920. The delay control circuit 920 may receive the external input clock signal $CLK_{EXT}$ from the input end IN, and determine how long the external input clock signal $CLK_{EXT}$ needs to be delayed (or shifted) according to the voltage level signal Vbias received from the digital-to-analog convertor 910.

Figure 10:
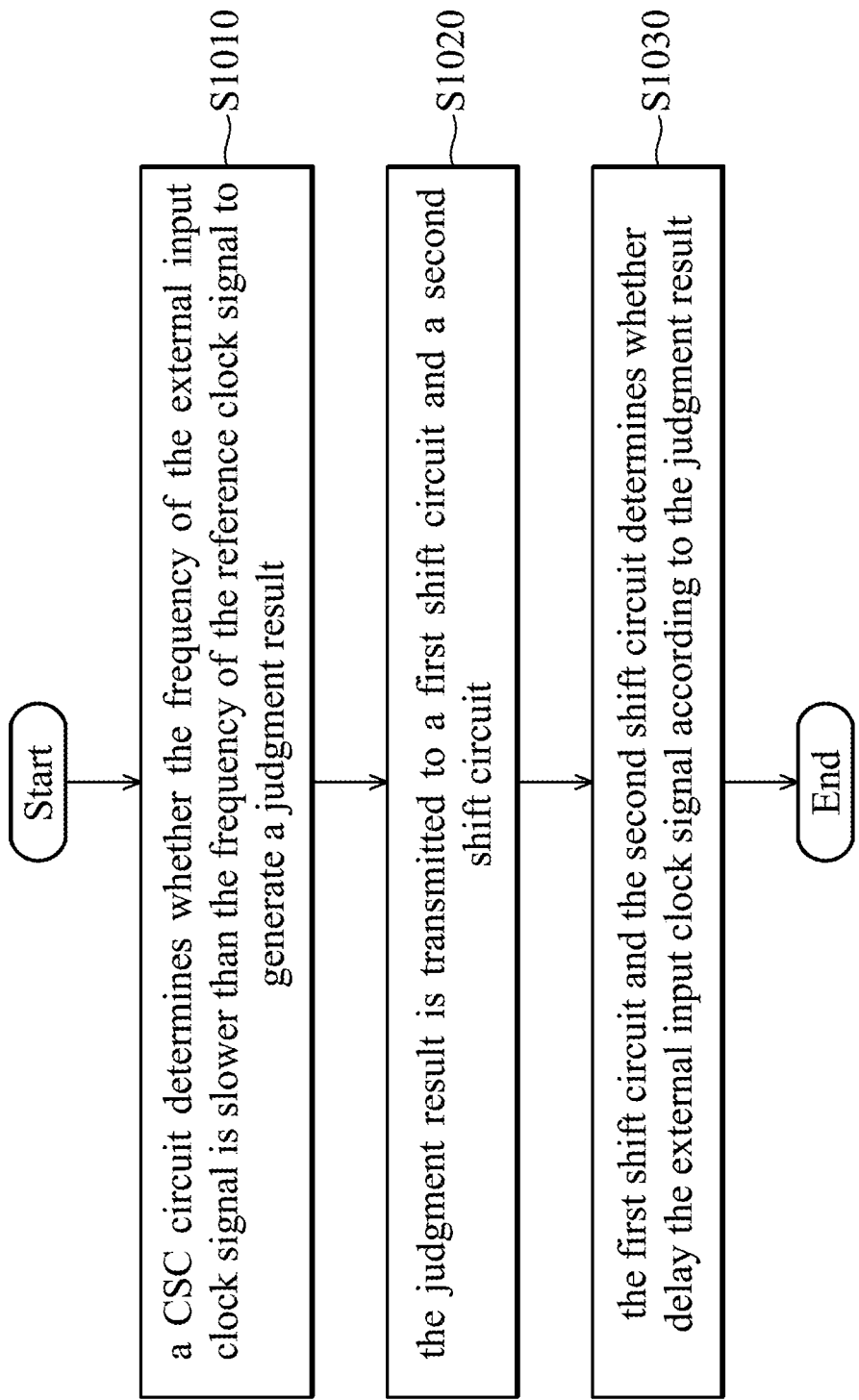
FIG. 10 is a flow chart illustrating a synchronous mirror delay (SMD) operation method according to an embodiment of the invention.

Referring to FIG. 10, an SMD operation method can be applied to the SMD circuit of the invention. In step S1010, a CSC circuit of the SMD circuit may determine whether the frequency of the external input clock signal $CLK_{EXT}$ is slower than the frequency of the reference clock signal $CLK_{BASE}$ to generate a judgment result CLKSLOW. In step S1020, the CSC circuit may transmit the judgment result CLKSLOW to a first shift circuit and a second shift circuit of the SMD circuit. In step S1030, the first shift circuit and the second shift circuit may determine whether delay the external input clock signal $CLK_{EXT}$ according to the judgment result CLKSLOW.

According to an embodiment of the invention, in the SMD operation method, when the frequency of the external input clock signal $CLK_{EXT}$ is slower than the frequency of the reference clock signal $CLK_{BASE}$, the judgment result CLKSLOW generated by the CSC circuit of the SMD circuit is a first level. When the frequency of the external input clock signal $CLK_{EXT}$ is not slower than the frequency of the reference clock signal $CLK_{BASE}$, the judgment result CLKSLOW generated by the CSC circuit of the SMD circuit is at a second level.

According to an embodiment of the invention, the SMD operation method further comprises that when the judgment result CLKSLOW is at the first level, the first shift circuit and the second shift circuit may determine how long the external input clock signal $CLK_{EXT}$ needs to be delayed according to the frequency of the reference clock signal $CLK_{BASE}$. When the judgment result CLKSLOW is at the second level, the first shift circuit and the second shift circuit may not delay the external input clock signal $CLK_{EXT}$.

According to an embodiment of the invention, the SMD operation method further comprises that a frequency divider of the SMD circuit may perform frequency division for the reference clock signal $CLK_{BASE}$ according different multiples, and the frequency divider may input the reference clock signals $CLK_{BASE}$ with different frequencies to each CSC unit of the CSC circuit respectively. Then, each CSC unit may transmit the judgment result CLKSLOW corresponding to different corresponding reference clock signals $CLK_{BASE}$ to the first shift circuit and the second shift circuit. According to an embodiment of the invention, the SMD operation method further comprises that a majority logic circuit of the SMD circuit may receive the judgment result CLKSLOW of each CSC unit, and the majority logic circuit may ignore the unreasonable judgment result according to all of the judgment results CLKSLOW.

According to an embodiment of the invention, in the SMD operation method, the first shift circuit and the second shift circuit may comprise a plurality of switches and a plurality of delay circuits. According to the judgment result CLKSLOW, if the external input clock signal $CLK_{EXT}$ needs to be delayed, the first shift circuit and the second shift circuit may enable one or more of the switches to determine how long the external input clock signal $CLK_{EXT}$ needs to be delayed. According to another embodiment of the invention, in the SMD operation method, the first shift circuit and the second shift circuit may comprise a digital-to-analog convertor and a delay control circuit. The digital-to-analog convertor may receive the judgment result CLKSLOW, and according to the judgment result CLKSLOW, the digital-to-analog convertor may generate the voltage level signal Vbias corresponding to the judgment result CLKSLOW. The delay control circuit may determine whether to delay the external input clock signal $CLK_{EXT}$ according to the voltage level signal Vbias, and when the external input clock signal $CLK_{EXT}$ needs to be delayed, the delay control circuit may determine how long the external input clock signal $CLK_{EXT}$ needs to be delayed according to the voltage level signal Vbias.

According to the SMD operation method provided in the embodiments of the invention, when the external input clock signal $CLK_{EXT}$ is too slow, the external input clock signal $CLK_{EXT}$ will be delayed a period of time. Therefore, the internal operation clock signal $CLK_{INT}$ can synchronize with the original external input clock signal $CLK_{EXT}$ without configuring too many stages of delay units in the forward delay circuit, the phase detector circuit, and the backward delay circuit of the SMD circuit. Therefore, according to the SMD operation method provided in the embodiments of the invention, the higher current consumption of the SMD circuit can be avoided and the size of the SMD circuit can be decreased during the manufacturing process of the SMD circuit. In addition, the SMD circuit provided in the embodiments of the invention can be applied to or operated in a larger frequency bandwidth (i.e. wide-range).

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A synchronous mirror delay (SMD) circuit, comprising:
    a delay monitor circuit (DMC), coupled to an input buffer;
    a forward delay circuit;
    a first shift circuit; coupled to the DMC and the forward delay circuit;
    a backward delay circuit;
    a second shift circuit, coupled to the backward delay circuit and a clock driver; and
    a clock-frequency-checker (CSC) circuit, coupled to the first shift circuit and the second shift circuit,
    wherein the CSC circuit determines whether the frequency of an external input clock signal is slower than the frequency of a reference clock signal to generate a judgment result, and the CSC circuit transmits the judgment result to the first shift circuit and the second shift circuit, and
    wherein the first shift circuit and the second shift circuit determine whether to delay the external input clock signal based on the judgment result.

2. The SMD circuit of claim 1, wherein the delay generated by the first shift circuit and the second shift circuit is longer than the delay generated by the forward delay circuit and the backward delay circuit.

3. The SMD circuit of claim 1, wherein the CSC circuit includes a plurality of CSC units.

4. The SMD circuit of claim 3, further comprising:
    a frequency divider, coupled to the CSC circuit,
    wherein the frequency divider performs frequency division for the reference clock signal to generate the reference clock signals with different frequencies and transmits the reference clock signals with different frequencies to each CSC unit respectively, and
    wherein each CSC unit respectively transmits the judgment result corresponding to the reference clock signals with different frequencies to the first shift circuit and the second shift circuit.

5. The SMD circuit of claim 4, wherein the CSC circuit further comprises:
    a majority logic circuit, coupled to each CSC unit,
    wherein the majority logic circuit receives the judgment result of each CSC unit, and according to all of the judgment results, the majority logic circuit ignores any unreasonable judgment results.

6. The SMD circuit of claim 3, wherein the CSC circuit further comprises:
    a first register, receiving the reference clock signal and the external input clock signal;
    a second register, receiving a reverse reference clock signal and the external input clock signal;
    an AND gate, coupled to the first register and the second register, and generating a flag signal according to the output signals of the first register and the second register;
    a third register, coupled to the AND gate, and receiving the flag signal and a reverse external input clock signal; and
    an SR latch, coupled to the third register, and outputting the judgment result according to the output signal of the third register.

7. The SMD circuit of claim 1, wherein the first shift circuit and the second shift circuit respectively comprise:
    a plurality of switches; and
    a plurality of delay circuits, respectively generating different delay times;
    wherein according to the judgment result, if the external input clock signal needs to be delayed, one or more delay circuits are enabled to determine how long the external input clock signal needs to be delayed.

8. A synchronous mirror delay (SMD) operation method, applied to an SMD circuit, and comprising:
    determining, by a clock-frequency-checker (CSC) circuit of the SMD circuit, whether the frequency of an external input clock signal is slower than the frequency of a reference clock signal to generate a judgment result;
    transmitting the judgment result to a first shift circuit and a second shift circuit of the SMD circuit; and
    determining, by the first shift circuit and the second shift circuit, whether to delay the external input clock signal according to the judgment result.

9. The SMD method of claim 8, wherein the delay generated by the first shift circuit and the second shift circuit is longer than the delay generated by a forward delay circuit and a backward delay circuit of the SMD circuit.

10. The SMD method of claim 8, further comprising:
    when the frequency of the external input clock signal is slower than the frequency of the reference clock signal, the judgment result generated by the CSC circuit is at a first level; and
    when the frequency of the external input clock signal is not slower than the frequency of the reference clock signal, the judgment result generated by the CSC circuit is at a second level.

11. The SMD method of claim 10, further comprising:
    when the judgment result is at the first level, determining how long the external input clock signal needs to be delayed by the first shift circuit and the second shift circuit according to the frequency of the reference clock signal; and
    when the judgment result is the second level, not delaying the external input clock signal by the first shift circuit and the second shift circuit previously.

12. The SMD method of claim 8, wherein the CSC circuit further comprises a plurality of CSC units, and the SMD method further comprises:
    performing, by a frequency divider, frequency division for the reference clock signal to generate the reference clock signals with different frequencies;
    transmitting the reference clock signals with different frequencies to each CSC unit respectively; and
    respectively transmitting, by each CSC unit, the judgment result corresponding to the reference clock signals with different frequencies to the first shift circuit and the second shift circuit.

13. The SMD method of claim 12, further comprising:
    receiving, by a majority logic circuit, the judgment result of each CSC unit; and
    according to all of the judgment results, ignoring, by the majority logic circuit, any unreasonable judgment results.

14. The SMD method of claim 8, wherein the first shift circuit and the second shift circuit respectively comprise a digital-to-analog convertor and a delay control circuit, and the SMD method further comprises:
- receiving, by the digital-to-analog convertor, the judgment result and according to the judgment result, generating a voltage level signal corresponding to the judgment result; and
- a plurality of delay circuits, respectively generating different delay times;
- determining, by the delay control circuit, whether to delay the external input clock signal according to the voltage level signal, and if the external input clock signal needs to be delayed, determining how long the external input clock signal needs to be delayed.

* * * * *